United States Patent
Oh et al.

(10) Patent No.: US 8,030,640 B2
(45) Date of Patent: Oct. 4, 2011

(54) NITRIDE SEMICONDUCTOR LIGHT EMITTING DEVICE AND METHOD OF MANUFACTURING THE SAME

(75) Inventors: Jeong Tak Oh, Gyunggi-do (KR); Yong Chun Kim, Gyunggi-do (KR); Dong Joon Kim, Gyunggi-do (KR); Dong Ju Lee, Gyunggi-do (KR)

(73) Assignee: Samsung LED Co., Ltd., Gyunggi-do (KR)

( * ) Notice: Subject to any disclaimer, the term of this patent is extended or adjusted under 35 U.S.C. 154(b) by 85 days.

(21) Appl. No.: 12/618,164

(22) Filed: Nov. 13, 2009

(65) Prior Publication Data

US 2010/0207097 A1   Aug. 19, 2010

(30) Foreign Application Priority Data

Feb. 17, 2009   (KR) .................. 10-2009-0012994

(51) Int. Cl.
*H01L 33/00* (2010.01)
*H01L 21/30* (2006.01)

(52) U.S. Cl. ............... 257/13; 257/14; 257/15; 257/94; 257/E33.005; 257/E33.006; 257/E33.01; 257/E21.211; 438/43; 438/46; 438/47

(58) Field of Classification Search .............. 257/13, 257/14, 15, 94, E33.005, E33.006, E33.01, 257/E21.211; 438/43, 46, 47
See application file for complete search history.

(56) References Cited

U.S. PATENT DOCUMENTS

| | | | | |
|---|---|---|---|---|
| 5,114,877 A * | 5/1992 | Paoli et al. | ....................... | 438/36 |
| 6,011,271 A * | 1/2000 | Sakuma et al. | .................. | 257/14 |
| 6,151,347 A * | 11/2000 | Noel et al. | .................. | 372/45.01 |
| 6,235,547 B1 * | 5/2001 | Sakuma et al. | .................. | 438/44 |
| 6,593,597 B2 | 7/2003 | Sheu | | |
| 7,154,125 B2 * | 12/2006 | Koide et al. | ..................... | 257/95 |
| 7,368,763 B2 * | 5/2008 | Miura et al. | .................. | 257/190 |
| 7,446,345 B2 * | 11/2008 | Emerson et al. | ................ | 257/95 |
| 7,611,917 B2 * | 11/2009 | Emerson et al. | ................ | 438/42 |
| 7,829,906 B2 * | 11/2010 | Donofrio | ........................ | 257/98 |
| 2002/0014622 A1 * | 2/2002 | Shimoyama et al. | ........... | 257/14 |
| 2007/0122994 A1 * | 5/2007 | Sonobe et al. | ................ | 438/426 |
| 2010/0044718 A1 * | 2/2010 | Hanser et al. | .................. | 257/76 |
| 2011/0068351 A1 * | 3/2011 | Donofrio | ........................ | 257/77 |

FOREIGN PATENT DOCUMENTS

| | | |
|---|---|---|
| JP | 10-135514 | 5/1998 |
| JP | 11-330554 | 11/1999 |
| JP | 2000-244072 | 9/2000 |
| KR | 10-2007-0035249 A | 3/2007 |

* cited by examiner

*Primary Examiner* — Victor A Mandala
(74) *Attorney, Agent, or Firm* — McDermott Will & Emery LLP

(57) ABSTRACT

A nitride semiconductor light emitting device includes a substrate, a first conductivity type nitride semiconductor layer disposed on the substrate and including a plurality of V-pits placed in a top surface thereof, a silicon compound formed in the vertex region of each of the V-pits, an active layer disposed on the first conductivity type nitride semiconductor layer and including depressions conforming to the shape of the plurality of V-pits, and a second conductivity type nitride semiconductor layer disposed on the active layer. The nitride semiconductor light emitting device, when receiving static electricity achieves high resistance to electrostatic discharge (ESD) since current is concentrated in the V-pits and the silicon compound placed on dislocations caused by lattice defects.

16 Claims, 4 Drawing Sheets

NITRIDE SEMICONDUCTOR LIGHT EMITTING DEVICE AND METHOD OF MANUFACTURING THE SAME

CROSS-REFERENCE TO RELATED APPLICATIONS

This application claims the priority of Korean Patent Application No. 10-2009-0012994 filed on Feb. 17, 2009, in the Korean Intellectual Property Office, the disclosure of which is incorporated herein by reference.

BACKGROUND OF THE INVENTION

1. Field of the Invention

The present invention relates to a semiconductor light emitting device and a method of manufacturing the same, and more particularly, to a nitride semiconductor light emitting device and a method of manufacturing the same, which can achieve high resistance to electrostatic discharge (ESD), and high light extraction efficiency.

2. Description of the Related Art

Light emitting diodes (LEDs), as one type of semiconductor light emitting device, generate light of various colors by electron-hole recombination occurring at a p-n junction when current is applied. LEDs are greatly advantageous over filament-based light emitting devices. That is, LEDs have a longer useful life span, lower voltage, superior initial driving characteristics, high vibration resistance and a high tolerance to repetitive power connection/disconnection. This has led to a continually increasing demand for LEDs. Notably, of late, a great deal of attention has been drawn to group III nitride semiconductors capable of emitting light in the short wavelength region including a blue-light region.

In general, group III nitride semiconductors (hereinafter, referred to as 'nitride semiconductors') have a composition of $Al_xGa_yIn_{1-x-y}N$ where $0 \leq x \leq 1$, $0 \leq y \leq 1$ and $0 \leq x+y \leq 1$. Such nitride semiconductor light emitting devices each include a light emitting structure obtained by sequentially growing an n-type nitride semiconductor layer, an active layer and a p-type nitride semiconductor layer. Light emission takes place as electrons from the n-type nitride semiconductor layer and holes from the p-type nitride semiconductor layer recombine in the active layer.

The light efficiency of nitride semiconductor light emitting devices is determined by external quantum efficiency and internal quantum efficiency. Here, the internal quantum efficiency reaches almost 100%, however the quantum external efficiency is excessively low.

Also, semiconductor light emitting devices are susceptible to electrostatic discharge (ESD), which is easily generated in people or objects. The resistance to ESD involves the reliability of semiconductor light emitting devices, and thus needs to be enhanced.

SUMMARY OF THE INVENTION

An aspect of the present invention provides a nitride semiconductor light emitting device which achieves high resistance to electrostatic discharge (ESD) and high light extraction efficiency.

According to an aspect of the present invention, there is provided a nitride semiconductor light emitting device including: a substrate; a first conductivity type nitride semiconductor layer disposed on the substrate and including a plurality of V-pits placed in a top surface thereof; a silicon compound formed in a vertex region of each of the V-pits; an active layer disposed on the first conductivity type nitride semiconductor layer and including depressions conforming to the shape of the plurality of V-pits; and a second conductivity type nitride semiconductor layer disposed on the active layer.

The silicon compound may fill part of the V-pit from the vertex region thereof. The silicon compound may include pores therein.

The silicon compound may be a silicon nitride or a silicon oxide.

The nitride semiconductor light emitting device may further include a first conductivity type nitride-based superlattice layer disposed between the first conductivity type nitride semiconductor layer and the active layer, and including depressions conforming to the shape of the plurality of V-pits.

The nitride semiconductor light emitting device may further include a second conductivity type nitride-based superlattice layer disposed between the active layer and the second conductivity type nitride semiconductor layer, and including depressions conforming to the shape of the plurality of V-pits.

According to another aspect of the present invention, there is provided a method of manufacturing a nitride semiconductor light emitting device, the method including: growing a first conductivity type nitride semiconductor layer on a substrate, the first conductivity type nitride semiconductor layer including a plurality of V-pits placed in a top surface thereof; forming a silicon compound in a vertex region of each of the plurality of V-pits; growing an active layer on the first conductivity type nitride semiconductor layer, the active layer including depressions conforming to the shape of the plurality of V-pits; and growing a second conductivity type nitride semiconductor layer on the active layer.

The growing of the first conductivity type nitride semiconductor layer may include forming the plurality of V-pits in the top surface of the first conductivity type nitride semiconductor layer by controlling a growth temperature. The growth temperature may range from 700° C. to 1000° C.

The growing of the first conductivity type nitride semiconductor layer may include forming the plurality of V-pits in the top surface of the first conductivity type nitride semiconductor layer through chemical etching.

The forming of the silicon compound in the vertex region of each of the V-pits may include forming the silicon compound in the vertex region of each of the V-pits by controlling a formation temperature of the silicon compound.

Alternatively, the forming of the silicon compound in the vertex region of each of the V-pits may include forming a silicon compound entirely on the first conductivity type nitride semiconductor layer, and performing chemical etching to remove the formed silicon compound excluding the silicon compound placed in the vertex region of each of the V-pits.

In the growing of the active layer, a growth temperature may be 900° C. or less.

In the growing of the second conductivity type nitride semiconductor layer, a growth temperature may be 1000° C. or higher.

The method may further include forming a first conductivity type nitride-based superlattice layer, which includes depressions conforming to the shape of the plurality of V-pits formed in the top surface of the first conductivity type nitride semiconductor layer, on the first conductivity type nitride semiconductor layer after the growing of the first conductivity type nitride semiconductor layer.

The method may further include forming a second conductivity type nitride-based superlattice layer, which includes depressions conforming to the shape of the plurality of V-pits, on the active layer after the growing of the active layer.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
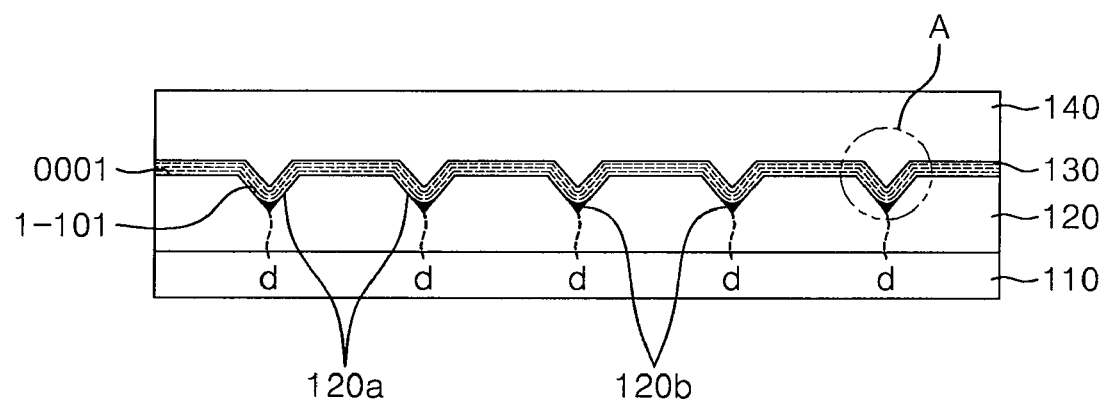
FIG. 1 is a cross-sectional view illustrating a nitride semiconductor light emitting device according to an exemplary embodiment of the present invention.

Exemplary embodiments of the present invention will now be described in detail with reference to the accompanying drawings. The invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the shapes and dimensions of elements may be exaggerated for clarity. Like reference numerals in the drawings denote like elements, and thus their description will be omitted.

FIG. 1 is a cross-sectional view showing a nitride semiconductor light emitting device according to an exemplary embodiment of the present invention. Referring to FIG. 1, a nitride semiconductor light emitting device 100 includes a substrate 110; a first conductivity type nitride semiconductor layer 120 disposed on the substrate 110 and including a plurality of V-shaped pits 120a (hereinafter, referred to as 'V-pits') formed in its top surface; a silicon compound 120b formed in the vertex region of each of the V-pits 120a; an active layer 130 disposed on the first conductivity type nitride semiconductor layer 120 and including depressions conforming to the shape of the plurality of V-pits 120a; and a second conductivity type nitride semiconductor layer 140 disposed on the active layer 130. In order to apply voltage to the first and second conductivity type nitride semiconductor layers 120 and 140, the nitride semiconductor light emitting device 100 may include a first electrode (not shown) disposed on a region exposed by mesa-etching the first conductivity type nitride semiconductor layer 120, and a second electrode (not shown) disposed on the second conductivity type nitride semiconductor layer 140.

The substrate 110 is not limited specifically, and may be an insulating substrate utilizing sapphire or spinel ($MgAl_2O_4$), or a semiconductor substrate utilizing SiC, Si, ZnO, GaAs or GaN.

The sapphire is a crystal body having Hexa-Rhombo (Hexa-Rhombo R3c) symmetry. The sapphire has a lattice constant of 13.001 Å in c-axis orientation, and a lattice distance of 4.765 Å in a-axis orientation; and has a C-plane (0001), an A-plane (1120) and an R-plane (1102). The C-plane of this sapphire substrate allows a nitride thin film to be grown thereupon relatively easily and is stable even at high temperatures, thus it is predominantly utilized as a substrate for nitride growth.

The first conductivity type nitride semiconductor layer 120 and the second conductivity type nitride semiconductor layer 140 may be formed of a semiconductor material having a composition of $Al_xIn_yGa_{(1-x-y)}N$ where $0 \leq x \leq 1$, $0 \leq y \leq 1$ and $0 x+y \leq 1$ and doped with n-type dopants and p-type dopants, respectively. A representative example of the semiconductor material may include GaN, AlGaN or InGaN. The n-type dopants may utilize Si, Ge, Se, Te, C or the like, and the p-type dopants may utilize Mg, Zn, Be or the like.

A plurality of V-pits are formed in the top surface of the first conductivity type nitride semiconductor layer 120. Strain is generated due to the different lattice constants between the substrate 110 and the first conductivity type nitride semiconductor layer 120. This strain acts as the cause of crystal defects such as dislocations. The plurality of V-pits 120a are generated on dislocations d resulting from lattice defects with respect to the substrate 110.

Figure 2:
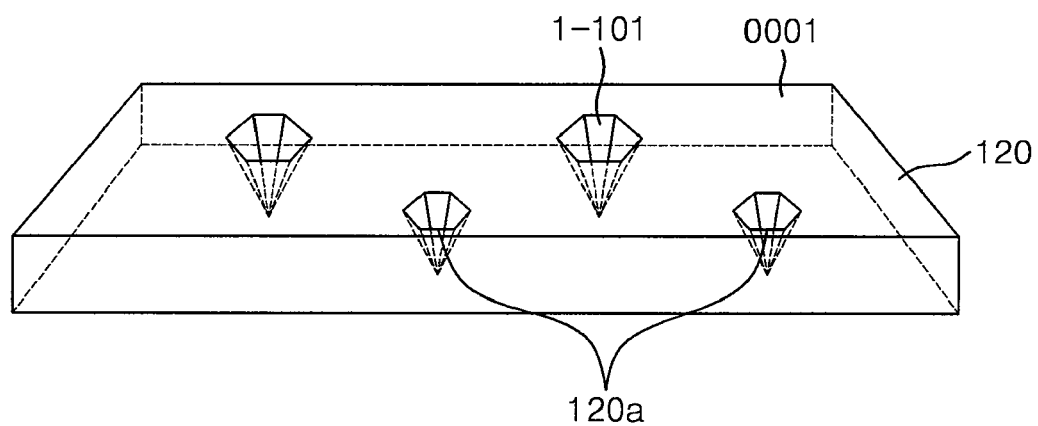
FIG. 2 is a perspective view illustrating a first conductivity type nitride semiconductor layer in the nitride semiconductor light emitting device according to an exemplary embodiment of the present invention.

FIG. 2 is a perspective view showing only the first conductivity type nitride semiconductor layer 120 of the semiconductor light emitting device according to an exemplary embodiment of the present invention. Referring to FIG. 2, the first conductivity type nitride semiconductor layer 120 includes a normal growth plane (0001) and inclined growth planes (1-101). The first conductivity type nitride semiconductor layer 120 is grown as a normal growth plane (0001), but also grown as inclined growth planes (1-101) at the dislocations d. The inclined growth planes (1-101) form the plurality of V-pits 120a. In this case, the V-pits 120a each have a hexagonal top portion, and a V-shaped cross-section.

Figure 3:
FIG. 3 is a microscope image showing the top surface of a first conductivity type nitride semiconductor layer according to an exemplary embodiment of the present invention.
Figure 4:
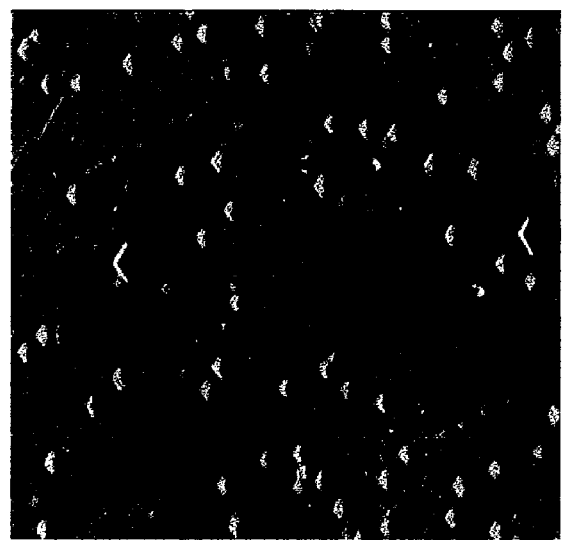
FIG. 4 is an atomic force microscope (AFM) image showing the top surface of a first conductivity type nitride semiconductor layer according to an exemplary embodiment of the present invention.

FIGS. 3 and 4 are images showing the top surface of the first conductivity type nitride semiconductor layer 120. FIG. 3 is a microscope image showing the first conductivity type nitride semiconductor layer 120 including V-pits formed by controlling a growth temperature, and FIG. 4 is an AFM image showing the first conductivity type nitride semiconductor layer 120 including V-pits formed by chemical etching. A method of forming the first conductivity type nitride semiconductor layer 120 including a plurality of V-pits 120a in its top surface will be described later.

A silicon compound 120b is formed in the vertex region of each of the V-pits 120a. The silicon compound 120b is formed on the dislocations d caused by lattice defects, thus preventing the dislocations d from propagating as a thin film is grown. This ensures high crystalline properties and enhances reliability and light emission efficiency.

Figure 5:
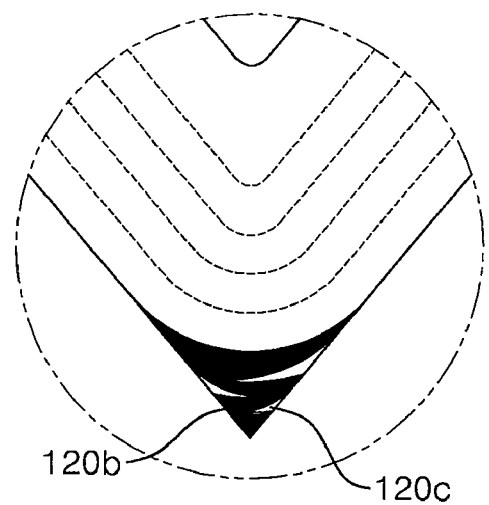
FIG. 5 is an enlarged cross-sectional view depicting part of a semiconductor light emitting device according to an exemplary embodiment of the present invention.

The silicon compound 120b, although not limited, may be a silicon nitride or a silicon oxide. The silicon nitride may be SiN or $Si_3N_4$, and the silicon oxide may be $SiO_2$. FIG. 5 is an enlarged cross-sectional view depicting part A of the semiconductor light emitting device depicted in FIG. 1. Referring to FIG. 5, the silicon compound 120b is formed in the vertex region of each V-pit 120a, thus filling part of each V-pit 120a. Also, the silicon compound 120b may include pores 120c therein. The pores 120c serve to minimize light absorption occurring inside a semiconductor and to cause diffused reflection, thereby ensuring high light extraction efficiency.

In general, a nitride semiconductor light emitting device may be easily damaged by electrostatic discharge (ESD) which is easily generated in people or objects at the time of molding or application to products. However, when static electricity is applied, the nitride semiconductor light emitting device 100, according to this embodiment of the present invention, achieves enhanced resistance to ESD since current is concentrated in the silicon compound 120b and the respectively V-pits 120a formed on the dislocations d caused by lattice defects. That is, the second conductivity type nitride semiconductor layer 140 formed in the region where the silicon compound 120b is present has the characteristic of a semi-insulator with low conductivity, so that the current can be blocked.

The active layer 130 is disposed on the first conductivity type nitride semiconductor layer 120, and has depressions conforming to the shape of the V-pits 120a in the first conductivity nitride semiconductor layer 120, respectively.

The active layer 130 generates light due to the recombination of electrons and holes, and may have a single or multiple quantum well structure. The active layer 130 may have a composition of $In_xAl_yGa_{(1-x-y)}N$ where $0 \leq x \leq 1$, $0 \leq y \leq 1$ and $0 x+y \leq 1$.

When formed on the first conductivity type nitride semiconductor layer 120, the active layer 130 is grown so as not to fill up the V-pits 120a entirely, by controlling the vertical and lateral growth rates at the normal growth plane (0001) and the inclined growth planes (1-101) on the first conductivity type nitride semiconductor layer 120. A method of forming such an active layer will be described later in detail.

The second conductivity type nitride semiconductor layer 140 is disposed on the active layer 130. The second conductivity type nitride semiconductor layer 140 is grown to fill up the depressions of the active layer 130 entirely by controlling the growth conditions thereof. The growth method thereof will be described later in detail.

Figure 6:
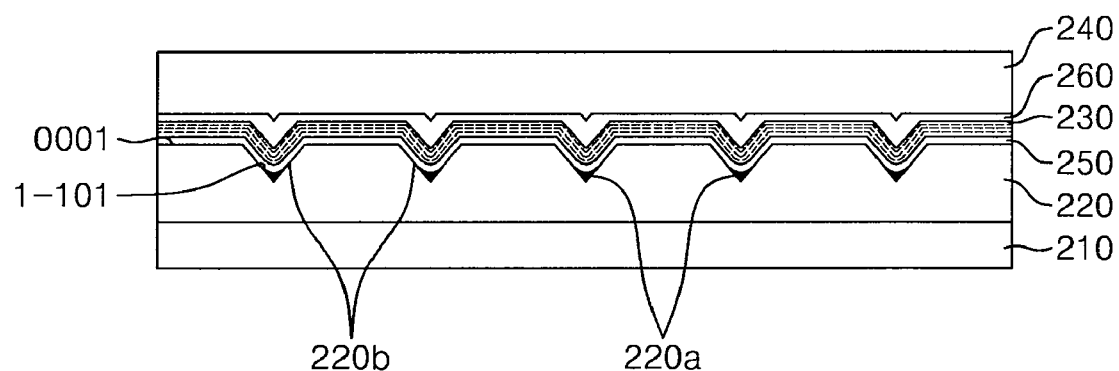
FIG. 6 is a cross-sectional view showing a nitride semiconductor light emitting device according to another exemplary embodiment of the present invention.

FIG. 6 is a cross-sectional view showing a nitride semiconductor light emitting device 200 according to another exemplary embodiment of the present invention. Referring to FIG. 6, a nitride semiconductor light emitting device 200, according to this embodiment of the present invention, includes a substrate 210; a first conductivity type nitride semiconductor layer 220 disposed on the substrate 210 and including a plurality of V-pits 220a formed in its top surface; a silicon compound 220b formed in the vertex region of each of the V-pits 220a; an active layer 230 disposed on the first conductivity type nitride semiconductor layer 220 and conforming to the shape of the plurality of V-pits 220a; and a second conductivity type nitride semiconductor layer 240 disposed on the active layer 230. To apply voltage to the first conductivity type and second conductivity type nitride semiconductor layers 220 and 240, the nitride semiconductor light emitting device 200 may include a first electrode (not shown) disposed on a region exposed by mesa-etching the first conductivity type nitride semiconductor layer 220, and a second electrode (not shown) disposed on the second conductivity type nitride semiconductor layer 240.

According to this embodiment, a first conductivity type nitride-based superlattice layer 250 may be further provided between the first conductivity type nitride semiconductor layer 220 and the active layer 230. The first conductivity type nitride-based superlattice layer 250, although not limited, may have a laminated structure of a plurality of AlGaN/GaN/InGaN layers. The first conductivity type nitride-based superlattice layer 250 includes depressions conforming to the shape of the V-pits 220a in the top surface of the first conductivity type nitride semiconductor layer 220.

Also, a second conductivity type nitride-based superlattice layer 260 may be further provided between the active layer 230 and the second conductivity type nitride semiconductor layer 240. The second conductivity type nitride-based superlattice layer 260, although not limited, may have a laminated structure of a plurality of AlGaN/GaN/InGaN layers. The second conductivity type nitride-based superlattice layer 260 includes depressions conforming to the shape of the V-pits 220a in the top surface of the first conductivity type nitride semiconductor layer 220. In more detail, the depressions on the second conductivity type nitride-based superlattice layer 260 are formed due to the depressions on the active layer 230.

Furthermore, other elements designated with like terms may be understood as being identical to those in the embodiment of FIG. 1, thus a description thereof will be omitted.

Figure 7A:
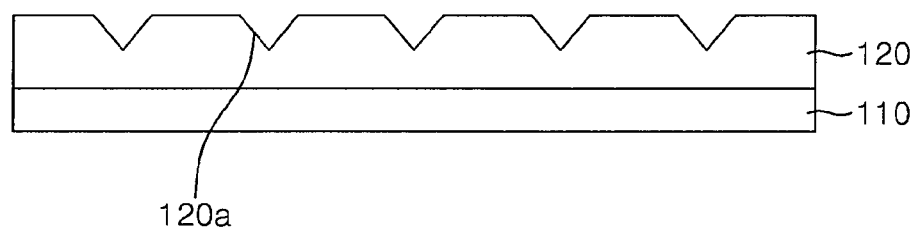
FIGS. 7A through 7C are cross-sectional views depicting a method of manufacturing a nitride semiconductor light emitting device, according to an exemplary embodiment of the present invention.
Figure 7B:
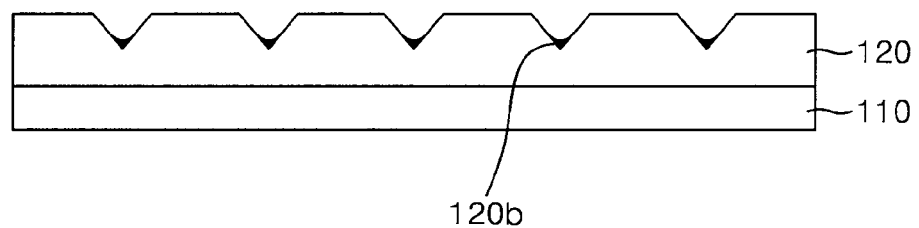
Figure 7C:
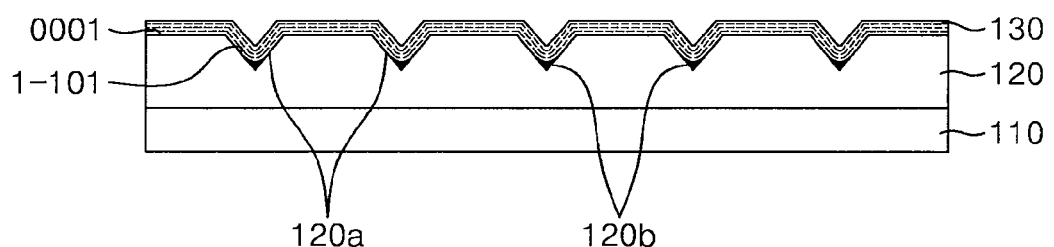

Hereinafter, a method of manufacturing the semiconductor light emitting device described above will be described. FIGS. 7A through 7C are cross-sectional views showing the method of manufacturing a semiconductor light emitting device according to an exemplary embodiment of the present invention.

A known process may be used to grow a first conductivity type nitride semiconductor layer, an active layer and a second conductivity type nitride semiconductor layer. An example of the known process may include metal-organic chemical vapor deposition (MOCVD), molecular beam epitaxy (MBE), or hydride vapor Phase Epitaxy (HVPE).

Hereinafter, a method using MOCVD will be described in detail.

Referring to FIG. 7A, a substrate 110 for growth is provided, and a first conductivity type nitride semiconductor layer 120 is grown on the substrate 110.

When the first conductivity type nitride semiconductor layer 120 is grown, a plurality of V-pits 120a may be formed in the top surface of the first conductivity type nitride semiconductor layer 120 by controlling the growth temperature thereof.

Strain is caused due to the different lattice constants of the substrate 110 and the first conductivity type nitride semiconductor layer 120. The strain creates dislocations (d) in the substrate 110 and the first conductivity type nitride semiconductor layer 120. If the temperature is controlled in an atmosphere in which nitrogen is used as a carrier gas, the growth of the first conductivity type nitride semiconductor layer 120 is suppressed at the dislocations (d), thus forming inclined growth planes. The inclined growth planes form the plurality of V-pits 120a at the dislocations (d). The growth temperature may range from 700° C. to 1000° C. FIG. 3 is a microscope image showing the top surface of the first conductivity type nitride semiconductor layer 120, including the plurality of V-pits 120a formed by controlling the growth temperature.

In addition, the first conductivity type nitride semiconductor layer 120 with the plurality of V-pits 120a may be grown by controlling the flux of a precursor or the internal pressure. Forming the V-pits by controlling the growth temperature may be performed in the same chamber, thereby preventing exposure to the outside environment and thus the generation of oxide layers or foreign bodies.

Alternatively, after the formation of the first conductivity type nitride semiconductor layer 120, a resultant structure may be taken out of a reactor, and then chemical etching is performed to form the plurality of V-pits 120a. Here, the plurality of V-pits 120a are rendered to be formed on dislocations where lattice defects are present. FIG. 4 is an AFM image showing the top surface of the first conductivity type nitride semiconductor layer 120 in which the plurality of V-pits 120a are formed through chemical etching.

Subsequently, as shown in FIG. 7B, a silicon compound is formed in the vertex region of each of the V-pits 120a.

The formation temperature of the silicon compound 120b may be somewhat higher than the growth temperature of the first conductivity type nitride semiconductor layer 120. To form the silicon compound 120b, the formation temperature is set between 900° C. to 1100° C., and a silicon (Si) precursor is supplied in an ammonia ($NH_3$) atmosphere. The Si precursor may utilize $SiH_4$, $Si_2H_6$ or ditertiarybutyl silane (DTBSi). The silicon compound 120b is formed first in the vertex region of the V-pit 120a. Thereafter, the Si precursor is supplied until the silicon compound 120b fills part of the V-pit 120a. The silicon compound 120b may have pores when formed in the V-pit 120a. The pores serve to minimize light absorption occurring inside a semiconductor and to cause diffused reflection, thereby enhancing light output.

Alternatively, a silicon compound may be formed on the entirety of the first conductivity type nitride semiconductor layer 120 without controlling the formation temperature of the silicon compound 120b, and then chemical etching may be performed to selectively remove the silicon compound, except for the silicon compound 120b formed in the vertex region of each V-pit 120a.

Thereafter, as shown in FIG. 7C, the active layer 130 having a single or multiple quantum well structure is grown by alternately laminating quantum-barrier and quantum-well layers on the first conductivity type nitride semiconductor layer 120. The active layer 130 has depressions conforming to the shape of the plurality of V-pits 120a formed in the top surface of the first conductivity type nitride semiconductor layer 120. In detail, the active layer 130 is grown with its vertical and lateral growth rates controlled at the normal growth plane and the inclined growth planes of the first conductivity type nitride semiconductor layer 120, such that it has depressions conforming to the shape of the respective V-pits 120a without filling up the V-pits 120a entirely. The layer growth rates may be controlled by the flux of a precursor, the pressure and the growth temperature. For example, the growth temperature may be maintained at 900° C. or lower.

Thereafter, the second conductivity type nitride semiconductor layer 140 is grown on the active layer 130. The second conductivity type nitride semiconductor layer 140 is grown with its vertical and lateral growth rates controlled such that it fills up the depressions of the active layer 130 entirely without forming depressions therein. The layer growth rates may be controlled by the use of the flux of a precursor, the pressure and the growth temperature. For example, the growth temperature may be maintained at 1000° C. or higher. In such a manner, a nitride semiconductor light emitting device having a structure as illustrated in FIG. 1 can be manufactured.

Although not shown, a first conductivity type nitride-based superlattice layer may be formed on the first conductivity type nitride semiconductor layer 120 before the growth of the active layer 130. The first conductivity type nitride superlattice layer may be formed by laminating a plurality of AlGaN/GaN/InGaN layers. The first conductivity type nitride-based superlattice layer includes depressions conforming to the shape of the respective V-pits 120a placed in the top surface of the first conductivity type nitride semiconductor layer 120. The growth method of the first conductivity type nitride superlattice layer is similar to that of the active layer 130.

Although not shown, a second conductivity type nitride-based superlattice layer may be formed on the active layer 130 before the growth of the second conductivity type semiconductor layer 140. The second conductivity type nitride-based superlattice layer may be formed by laminating a plurality of AlGaN/GaN/InGaN layers.

The second conductivity type nitride superlattice layer includes depressions conforming to the shape of the V-pits 120a placed in the top surface of the first conductivity type nitride semiconductor layer 120. The growth method of the second conductivity type nitride superlattice layer is similar to that of the active layer 130.

In the case that the first conductivity type nitride-based superlattice layer and the second conductivity type nitride-based superlattice layer are formed in the above manner, a nitride semiconductor light emitting device having a structure as illustrated in FIG. 6 can be manufactured.

As set forth above, according to exemplary embodiments of the invention, when static electricity is applied to the nitride semiconductor light emitting device according to the present invention, current is concentrated in the V-pits and the silicon compound formed on dislocations caused by lattice defects, thus achieving high resistance to ESD. Also, the silicon compound including pores therein serves to minimize light absorption occurring inside a semiconductor and to cause diffused reflection, thereby achieving high light extraction efficiency.

While the present invention has been shown and described in connection with the exemplary embodiments, it will be apparent to those skilled in the art that modifications and variations can be made without departing from the spirit and scope of the invention as defined by the appended claims.

What is claimed is:

1. A nitride semiconductor light emitting device comprising:
    a substrate;
    a first conductivity type nitride semiconductor layer disposed on the substrate and including a plurality of V-pits placed in a top surface thereof;
    a silicon compound formed in a vertex region of each of the V-pits;
    an active layer disposed on the first conductivity type nitride semiconductor layer and including depressions conforming to the shape of the plurality of V-pits; and
    a second conductivity type nitride semiconductor layer disposed on the active layer.

2. The nitride semiconductor light emitting device of claim 1, wherein the silicon compound fills part of the V-pit from the vertex region thereof.

3. The nitride semiconductor light emitting device of claim 1, wherein the silicon compound includes pores therein.

4. The nitride semiconductor light emitting device of claim 1, wherein the silicon compound is a silicon nitride or a silicon oxide.

5. The nitride semiconductor light emitting device of claim 1, further comprising a first conductivity type nitride-based superlattice layer disposed between the first conductivity type nitride semiconductor layer and the active layer, and including depressions conforming to the shape of the plurality of V-pits.

6. The nitride semiconductor light emitting device of claim 1, further comprising a second conductivity type nitride-based superlattice layer disposed between the active layer and the second conductivity type nitride semiconductor layer, and including depressions conforming to the shape of the plurality of V-pits.

7. A method of manufacturing a nitride semiconductor light emitting device, the method comprising:
   growing a first conductivity type nitride semiconductor layer on a substrate, the first conductivity type nitride semiconductor layer including a plurality of V-pits placed in a top surface thereof;
   forming a silicon compound in a vertex region of each of the plurality of V-pits;
   growing an active layer on the first conductivity type nitride semiconductor layer, the active layer including depressions conforming to the shape of the plurality of V-pits; and
   growing a second conductivity type nitride semiconductor layer on the active layer.

8. The method of claim 7, wherein the growing of the first conductivity type nitride semiconductor layer comprises forming the plurality of V-pits in the top surface of the first conductivity type nitride semiconductor layer by controlling a growth temperature.

9. The method of claim 8, wherein the growth temperature ranges from 700° C. to 1000° C.

10. The method of claim 7, wherein the growing of the first conductivity type nitride semiconductor layer comprises forming the plurality of V-pits in the top surface of the first conductivity type nitride semiconductor layer through chemical etching.

11. The method of claim 7, wherein the forming of the silicon compound in the vertex region of each of the V-pits comprises forming the silicon compound in the vertex region of each of the V-pits by controlling a formation temperature of the silicon compound.

12. The method of claim 7, wherein the forming of the silicon compound in the vertex region of each of the V-pits comprises forming a silicon compound entirely on the first conductivity type nitride semiconductor layer, and performing chemical etching to remove the formed silicon compound excluding the silicon compound placed in the vertex region of each of the V-pits.

13. The method of claim 7, wherein in the growing of the active layer, a growth temperature is 900° C. or less.

14. The method of claim 7, wherein in the growing of the second conductivity type nitride semiconductor layer, a growth temperature is 1000° C. or higher.

15. The method of claim 7, further comprising forming a first conductivity type nitride-based superlattice layer, which includes depressions conforming to the shape of the plurality of V-pits formed in the top surface of the first conductivity type nitride semiconductor layer, on the first conductivity type nitride semiconductor layer after the growing of the first conductivity type nitride semiconductor layer.

16. The method of claim 7, further comprising forming a second conductivity type nitride-based superlattice layer, which includes depressions conforming to the shape of the plurality of V-pits, on the active layer after the growing of the active layer.

* * * * *